US012796371B2

(12) United States Patent
Garikipati et al.

(10) Patent No.: US 12,796,371 B2
(45) Date of Patent: Nov. 10, 2026

(54) MODULAR MULTI-DIRECTIONAL GAS MIXING BLOCK

(71) Applicant: Applied Materials, Inc., Santa Clara, CA (US)

(72) Inventors: Kiran Garikipati, Gilbert, AZ (US); Kurt R. Langeland, San Jose, CA (US); Syed A. Alam, San Jose, CA (US); Senthil Vel Mohan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/899,324

(22) Filed: Sep. 27, 2024

(65) Prior Publication Data

US 2026/0096371 A1 Apr. 2, 2026

(51) Int. Cl.
*H10P 72/00* (2026.01)
*F16K 27/00* (2006.01)

(52) U.S. Cl.
CPC ........ *H10P 72/0402* (2026.01); *F16K 27/003* (2013.01); *Y10T 137/87249* (2015.04); *Y10T 137/87885* (2015.04)

(58) Field of Classification Search
None
See application file for complete search history.

(56) References Cited

U.S. PATENT DOCUMENTS 5,313,985 A * 5/1994 Donner ................. D06F 39/088 137/884
5,488,925 A * 2/1996 Kumada ............... C23C 16/455 137/884
5,819,782 A * 10/1998 Itafuji ................. F15B 13/0807 137/271
5,904,381 A * 5/1999 Ohmi ...................... F16L 23/16 285/379

(Continued)

FOREIGN PATENT DOCUMENTS

JP 2016223533 A 12/2016
TW 202332797 A 8/2023

OTHER PUBLICATIONS

International Application No. PCT/US2025/047683, International Search Report and Written Opinion mailed on Jan. 28, 2026, 11 pages.

(Continued)

*Primary Examiner* — Matthew W Jellett
(74) *Attorney, Agent, or Firm* — Kilpatrick Townsend & Stockton LLP

(57) ABSTRACT

Exemplary modular gas blocks may include a body having an inlet end and an outlet end. The body may define a first fluid channel extending along a length and may define a second fluid channel extending along a width. The inlet end may define a fluid inlet that is coupled with the first fluid channel. The outlet end may define a first fluid outlet that is coupled with the first fluid channel. An upper surface of the body may define a first fluid port that is coupled with the fluid inlet via the first fluid channel. The upper surface of the (Continued)

body may define a second fluid port that is coupled with the second fluid channel. The body may define a third fluid port that is coupled with the second fluid port via the second fluid channel.

19 Claims, 12 Drawing Sheets

(56) References Cited

U.S. PATENT DOCUMENTS

| | | | | |
|---|---|---|---|---|
| 5,964,481 | A * | 10/1999 | Buch | F15B 13/0896 285/125.1 |
| 5,992,463 | A * | 11/1999 | Redemann | H01J 37/3244 137/884 |
| 6,068,016 | A * | 5/2000 | Manofsky, Jr. | F15B 13/0896 137/271 |
| 6,293,310 | B1 * | 9/2001 | Redemann | H01J 37/3244 137/884 |
| 6,302,141 | B1 * | 10/2001 | Markulec | F16K 27/003 137/271 |
| 6,349,744 | B1 * | 2/2002 | Grosshart | C23C 16/44 137/884 |
| 6,394,138 | B1 * | 5/2002 | Vu | C23C 16/45561 137/884 |
| 6,415,822 | B1 * | 7/2002 | Hollingshead | F16K 27/003 285/120.1 |
| 6,769,463 | B2 * | 8/2004 | Vu | F16K 27/003 137/884 |
| 7,004,199 | B1 * | 2/2006 | Funes | F17D 1/04 137/884 |
| 7,458,397 | B2 * | 12/2008 | Doyle | F17D 1/04 137/884 |
| 7,806,143 | B2 * | 10/2010 | Taskar | F16K 27/003 137/884 |
| 8,281,816 | B2 * | 10/2012 | Nakata | F16K 27/003 137/884 |
| 8,322,380 | B2 * | 12/2012 | Taskar | F16L 41/03 137/884 |
| 8,794,267 | B2 * | 8/2014 | Shareef | H01L 21/67253 137/884 |
| 8,950,433 | B2 * | 2/2015 | Manofsky, Jr. | F17D 1/00 137/884 |
| 9,850,920 | B2 * | 12/2017 | Inada | F15B 13/0814 |
| 10,982,694 | B2 * | 4/2021 | Chan | F15B 13/0817 |
| 2005/0284529 | A1 * | 12/2005 | Iwabuchi | F16K 27/003 137/884 |
| 2006/0011246 | A1 * | 1/2006 | Leys | F17D 1/04 137/884 |
| 2007/0289652 | A1 * | 12/2007 | Curran | F16L 47/03 137/884 |
| 2008/0302426 | A1 * | 12/2008 | Mulligan | F16K 27/003 137/271 |
| 2010/0096031 | A1 | 4/2010 | Okase et al. | |
| 2015/0075660 | A1 * | 3/2015 | Inada | F15B 13/0871 137/884 |
| 2018/0004235 | A1 | 1/2018 | Mudd et al. | |
| 2019/0271402 | A1 * | 9/2019 | Doya | F16K 27/003 |
| 2021/0207624 | A1 | 7/2021 | Chan | |
| 2023/0288007 | A1 | 9/2023 | Benjamin Raj et al. | |

OTHER PUBLICATIONS

Taiwanese Application No. 114137152, Office Action mailed on May 28, 2026, 11 pages (10 pages of original document and 1 page of English Translation).

* cited by examiner

MODULAR MULTI-DIRECTIONAL GAS MIXING BLOCK

TECHNICAL FIELD

The present technology relates to semiconductor processes and equipment. More specifically, the present technology relates to substrate processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Oftentimes, processing systems include gas delivery assemblies that may mix and/or otherwise deliver a number of process gases to the various chambers. The flow of these gases may be carefully controlled to ensure uniform flow of gases into each of the processing chambers.

Thus, there is a need for improved systems and methods that can be used to efficiently mix and/or otherwise deliver gases to processing chambers under desired conditions. These and other needs are addressed by the present technology.

SUMMARY

Exemplary modular gas blocks may include a block body having an inlet end and an outlet end. The block body may define a portion of a first fluid channel extending along a length of the block body and may define a second fluid channel extending along a width of the block body. The inlet end of the block body may define a fluid inlet that is fluidly coupled with the first fluid channel. The outlet end of the block body may define a first fluid outlet that is fluidly coupled with the first fluid channel. An upper surface of the block body may define a first fluid port that is fluidly coupled with the fluid inlet via the first fluid channel. The upper surface of the block body may define a second fluid port that is fluidly coupled with the second fluid channel. The block body may define a third fluid port that is fluidly coupled with the second fluid port via the second fluid channel.

In some embodiments, the first fluid channel and the second fluid channel may be fluidly isolated from one another within the block body. The third fluid port may be laterally offset from the first fluid outlet along the width of the block body. The block body may define a fourth fluid port that is fluidly coupled with the second fluid port and the third fluid port via the second fluid channel. The third fluid port may extend through an upward-facing surface of the block body and the fourth fluid port may extend through a downward-facing surface of the block body. The block body may have a generally Z-shaped cross-section along the width of the block body. The block body may have a generally T-shaped cross-section along the length of the block body. The fluid inlet, the first fluid port, the first fluid outlet, and the first fluid channel may be linearly aligned along the length of the block body. The second fluid port, the third fluid port, and the second fluid channel may be linearly aligned along the width of the block body.

Some embodiments of the present technology may encompass modular gas delivery assemblies. The assemblies may include an inlet block defining a first fluid inlet and a first fluid outlet. An inlet flow path may be fluidly coupled with the first fluid inlet and the first fluid outlet. The assemblies may include a modular gas block. The modular gas block may include a block body having an inlet end and an outlet end. The block body may define a portion of a first fluid channel extending along a length of the block body and may define a second fluid channel extending along a width of the block body. The inlet end of the block body may define a second fluid inlet that is interfaced with the first fluid outlet and is fluidly coupled with the first fluid channel. The outlet end of the block body may define a second fluid outlet that is fluidly coupled with the first fluid channel. An upper surface of the block body may define a first fluid port that is fluidly coupled with the second fluid inlet via the first fluid channel. The upper surface of the block body may define a second fluid port that is fluidly coupled with the second fluid channel. The block body may define a third fluid port that is fluidly coupled with the second fluid port via the second fluid channel. The assemblies may include an X-direction block that defines a third fluid inlet and a third fluid outlet. The third fluid inlet may be fluidly coupled with the second fluid outlet.

In some embodiments, the inlet block may define a plurality of fluid ports that are fluidly coupled with the inlet flow path. The assemblies may include a valve that is interfaced with and that fluidly couples the plurality of fluid ports of the inlet block. The assemblies may include a valve interfaced with the first fluid port and the second fluid port. The valve may fluidly couple the first fluid channel with the second fluid channel. The assemblies may include a weldment of a gas source. The weldment may be coupled with the first fluid inlet. The modular gas block may be a first modular gas block. The assemblies may include a second modular block that is coupled between the second fluid outlet and the third fluid inlet.

Some embodiments of the present technology may encompass modular gas delivery assemblies that include a plurality of gas sticks. Each gas stick may include an inlet block defining a first fluid inlet and a first fluid outlet. An inlet flow path may be fluidly coupled with the first fluid inlet and the first fluid outlet. Each gas stick may include a modular gas block. Each modular gas block may include a block body having an inlet end and an outlet end. The block body may define a portion of a first fluid channel extending along a length of the block body and may define a second fluid channel extending along a width of the block body. The inlet end of the block body may define a second fluid inlet that is interfaced with the first fluid outlet and is fluidly coupled with the first fluid channel. The outlet end of the block body may define a second fluid outlet that is fluidly coupled with the first fluid channel. An upper surface of the block body may define a first fluid port that is fluidly coupled with the second fluid inlet via the first fluid channel. The upper surface of the block body may define a second fluid port that is fluidly coupled with the second fluid channel. The block body may define a third fluid port that is fluidly coupled with the second fluid port via the second fluid channel. The block body may define a fourth fluid port that is fluidly coupled with the second fluid port and the third fluid port via the second fluid channel. Each gas stick may include an X-direction block that defines a third fluid inlet and a third fluid outlet. The third fluid inlet may be fluidly coupled with the second fluid outlet. The second fluid channel of at least two adjacent gas sticks may be fluidly coupled with one another by interfacing the third fluid port of a first modular gas block with the fourth fluid port of a second modular gas block.

In some embodiments, a length of each gas stick may define an X-direction, a width of each gas stick may define a Z-direction, and a thickness of each gas stick may define a Y-direction. Each of the first fluid port, the second fluid port, the third fluid port, and the fourth fluid port may extend along the Y-direction. The assemblies may include a plurality of gas sources. Each of the plurality of gas sources may be fluidly coupled with the first fluid inlet of the inlet block of one of the plurality of gas sticks. A first lateral surface of each modular gas block may include a concave mating feature. A second lateral surface of each modular gas block may include a convex mating feature. The first lateral surface of each modular gas block may be opposite the second lateral surface. Engagement between the concave mating feature of the first modular gas block and the convex mating feature of the second modular gas block may align the third fluid port of the first modular gas block with the fourth fluid port of the second modular gas block. The assemblies may include a plurality of seals. Each seal of the plurality of seals may be disposed at the interface between adjacent blocks forming the plurality of gas sticks.

Such technology may provide numerous benefits over conventional systems and techniques. For example, the processing systems may provide modular gas assembly components that may be easily assembled to produced customized gas assemblies. Additionally, the modular gas assembly components may facilitate mixing of different gases without the need for complex arrangements of weldments, which may reduce the time, cost, and complexity of gas delivery assemblies. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
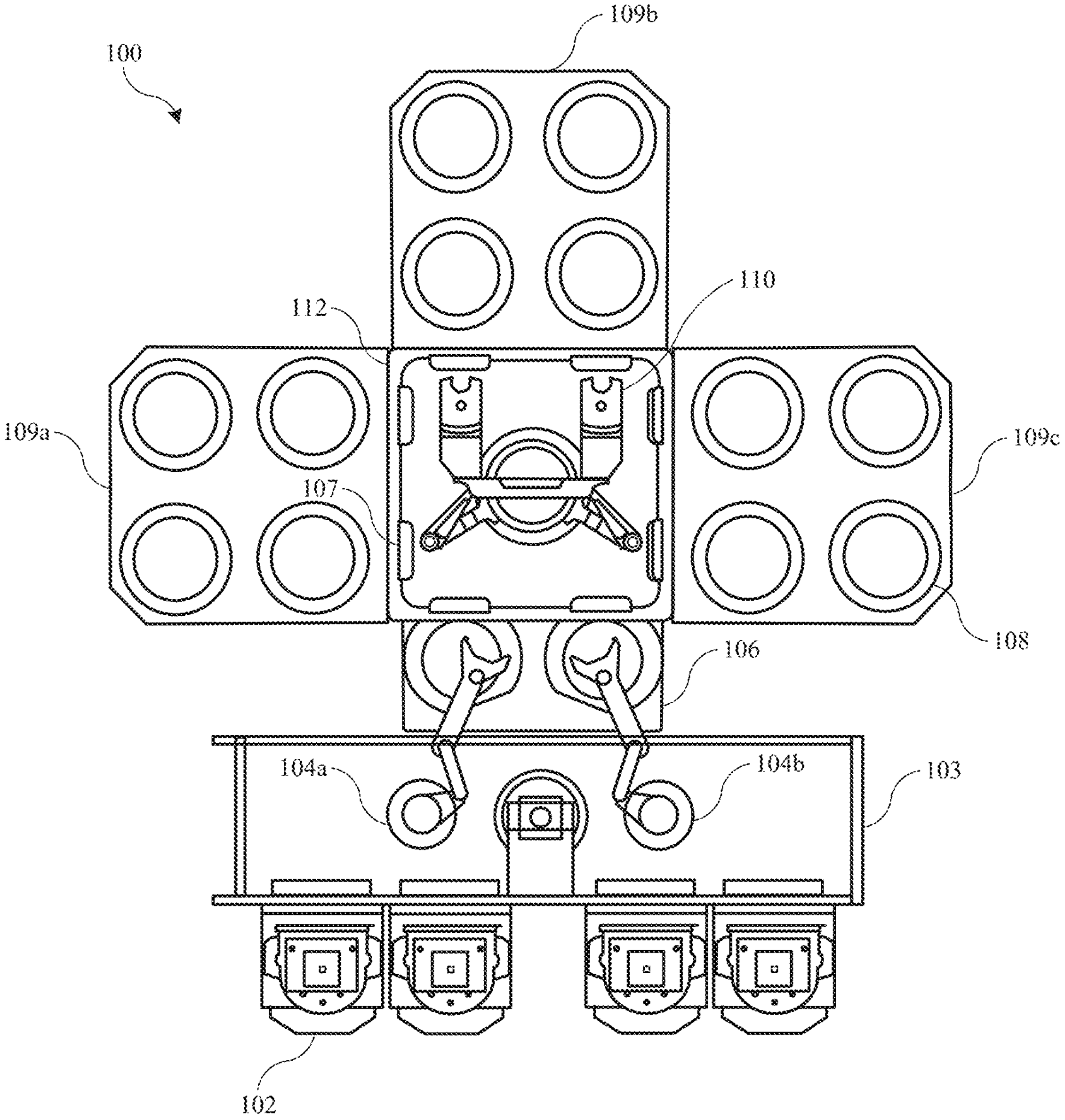
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

Processing systems may include gas delivery assemblies to deliver various gases to the processing chambers. To eliminate the need to have a different output delivery lumen for each type of gas being flowed to a given chamber or set of chambers, gas delivery assemblies are often designed to mix and co-flow compatible gases to the chambers. Conventional gas delivery assemblies deliver gases to an output weldment along a length (or x-axis) of the assembly. To facilitate mixing of the various gases, conventional systems utilize an array of different weldments that are typically provided beneath gas blocks on which valves, mass flow controllers, and/or other shut off and/or flow throttling components may be mounted. The network of weldments may be complex, which may lead to issues in designing and fabricating a new gas delivery assembly, altering an existing gas delivery assembly, and/or servicing an existing gas delivery assembly.

To design new gas delivery assemblies using conventional components requires engineers to design and/or weldments of a correct shape and size to properly connect various ports of a gas assembly, while ensuring that the weldments positioned beneath the gas blocks do not run into one another. The fabrication may be tedious and may involve the use of significant numbers of different weldments to achieve a functional assembly. Additionally, due to the complexity of the weldment configurations, engineers cannot design base assembly designs that may be easily altered to accommodate new assembly designs. Therefore, engineers must design each assembly from scratch. These issues may cause the design and fabrication of new assemblies to be slow (up to 15 weeks) and very expensive.

During altering (such as adding or subtracting a new gas source/gas stick) and/or servicing of existing gas delivery assemblies, technicians must remove all upper components (such as valves, mass flow controllers, gas blocks, and the like) to access the weldments. Oftentimes, a majority or entirety of the gas assembly may need to be disassembled to add or remove a gas stick. The network of weldments beneath the gas blocks may need to be completely redesigned and/or replaced to accommodate mixing of newly added gas sticks. Oftentimes, any weldments from a previous iteration of a gas delivery assembly must be scrapped, leading to considerable waste. Additionally, if modification and/or service of a gas assembly impacts a toxic gas stick, the entire toxic gas stick may need to be replaced to prevent any toxic gases from leaking into the environment. These issues may cause the modification or repair of existing assemblies to be slow (up to 18 weeks) and very expensive.

The present technology overcomes these issues by utilizing modular gas blocks that include lumens that facilitate gas mixing between adjacent gas sticks in the z-direction. Such lumens may eliminate the need for the network of weldments at the bottom of the gas delivery assembly and may significantly simplify the design and fabrication of the gas delivery assembly. All or most of the modular gas blocks may have an identical geometry, with the possibility that a small subset of the modular gas blocks have slightly different geometries that are compatible with the geometries of the other modular gas blocks. The use of such modular gas blocks may enable alteration of the gas delivery assembly to be as simple as connecting or removing a gas stick to or from an existing gas delivery assembly, without the need to expose other flow paths. This may eliminate the risk of exposing toxic gas sticks and may help reduce waste during alteration operations. Additionally, a purge gas stick may be provided that may be used to flush any toxic gas flow paths to further mitigate any risk of toxic gases during servicing of the gas delivery assembly. Such features may significantly shorten the time (oftentimes to less than 4-5 weeks) and cost associated with designing, fabricating, and/or otherwise altering a gas delivery assembly.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104*a* and 104*b* and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
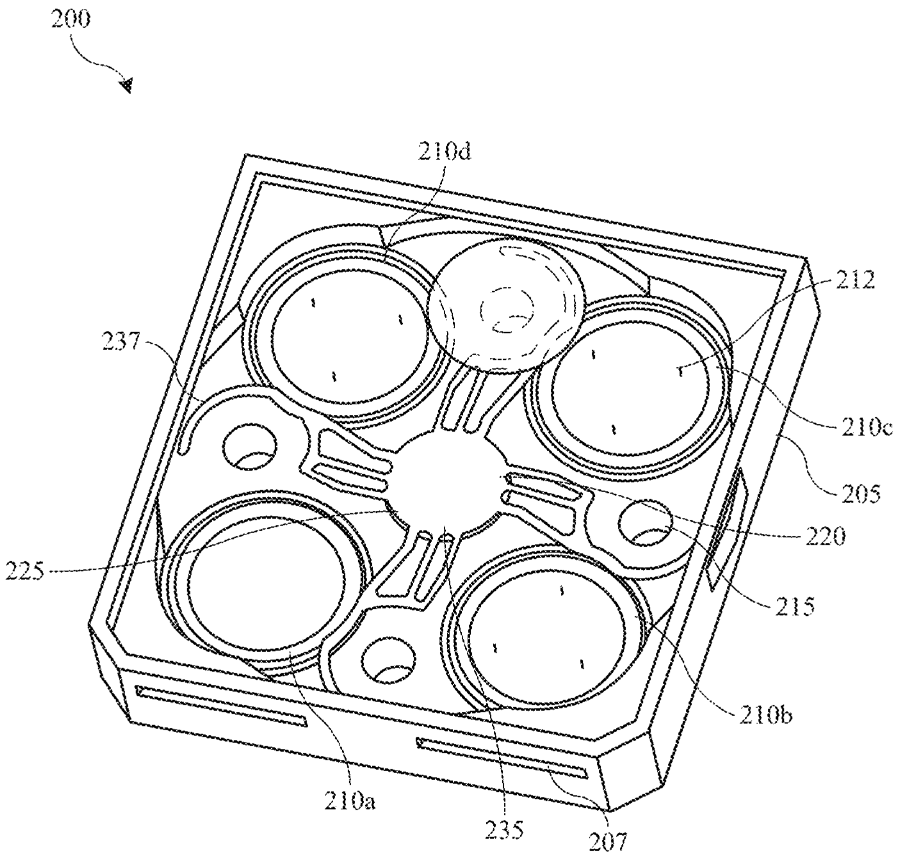
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210*a* or 210*b* through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210*a* and 210*b* to substrate supports 210*c* and 210*d*, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
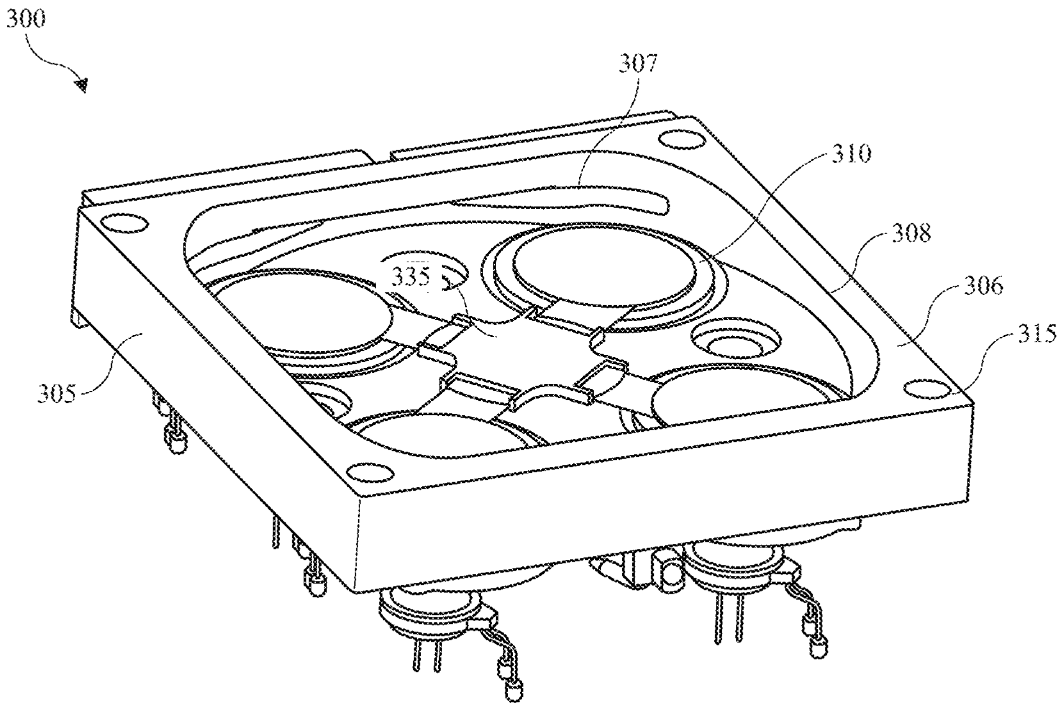
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above. FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
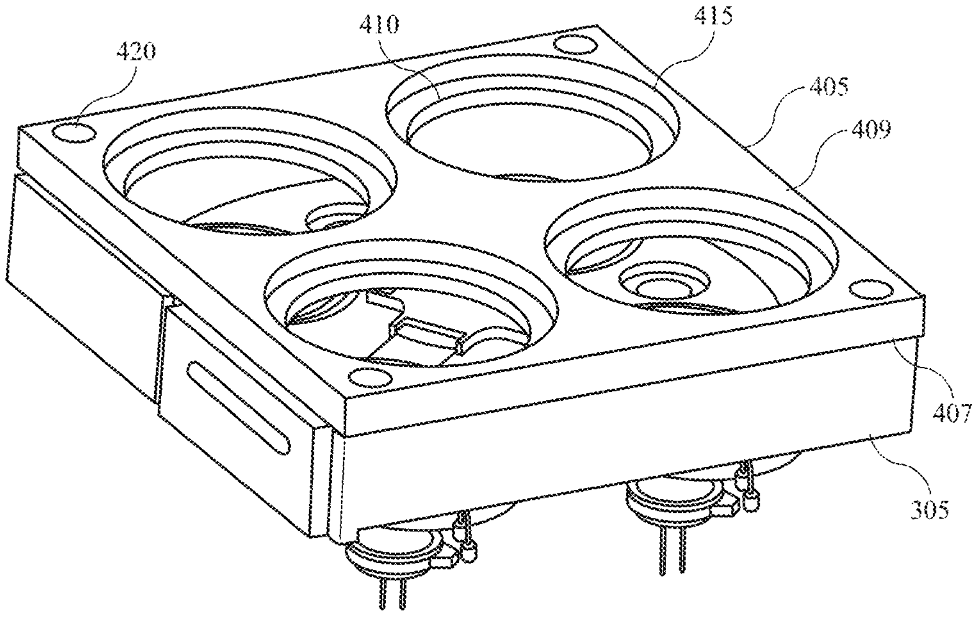
FIG. 4 shows a schematic isometric view of a transfer region of an exemplary chamber system according to some embodiments of the present technology.

FIG. 4 shows a schematic isometric view of overlying structures of chamber system 300 according to some embodiments of the present technology. For example, in some embodiments a first lid plate 405 may be seated on chamber body 305. First lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. First lid plate 405 may also define apertures 410, which may provide separation of overlying regions of the transfer chamber to form processing regions for substrate processing.

Apertures 410 may be defined through first lid plate 405, and may be at least partially aligned with substrate supports in the transfer region. In some embodiments, a number of apertures 410 may equal a number of substrate supports in the transfer region, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

First lid plate 405 may also include a second surface 409 opposite first surface 407. Second surface 409 may define a recessed ledge 415, which may produce an annular recessed shelf through the second surface 409 of first lid plate 405. Recessed ledges 415 may be defined about each aperture of the plurality of apertures 410 in some embodiments. The recessed shelf may provide support for lid stack components as will be described further below. Additionally, first lid plate 405 may define second apertures 420, which may at least partially define pumping channels from overlying components described below. Second apertures 420 may be axially aligned with apertures 315 of the chamber body 305 described previously.

Figure 5:
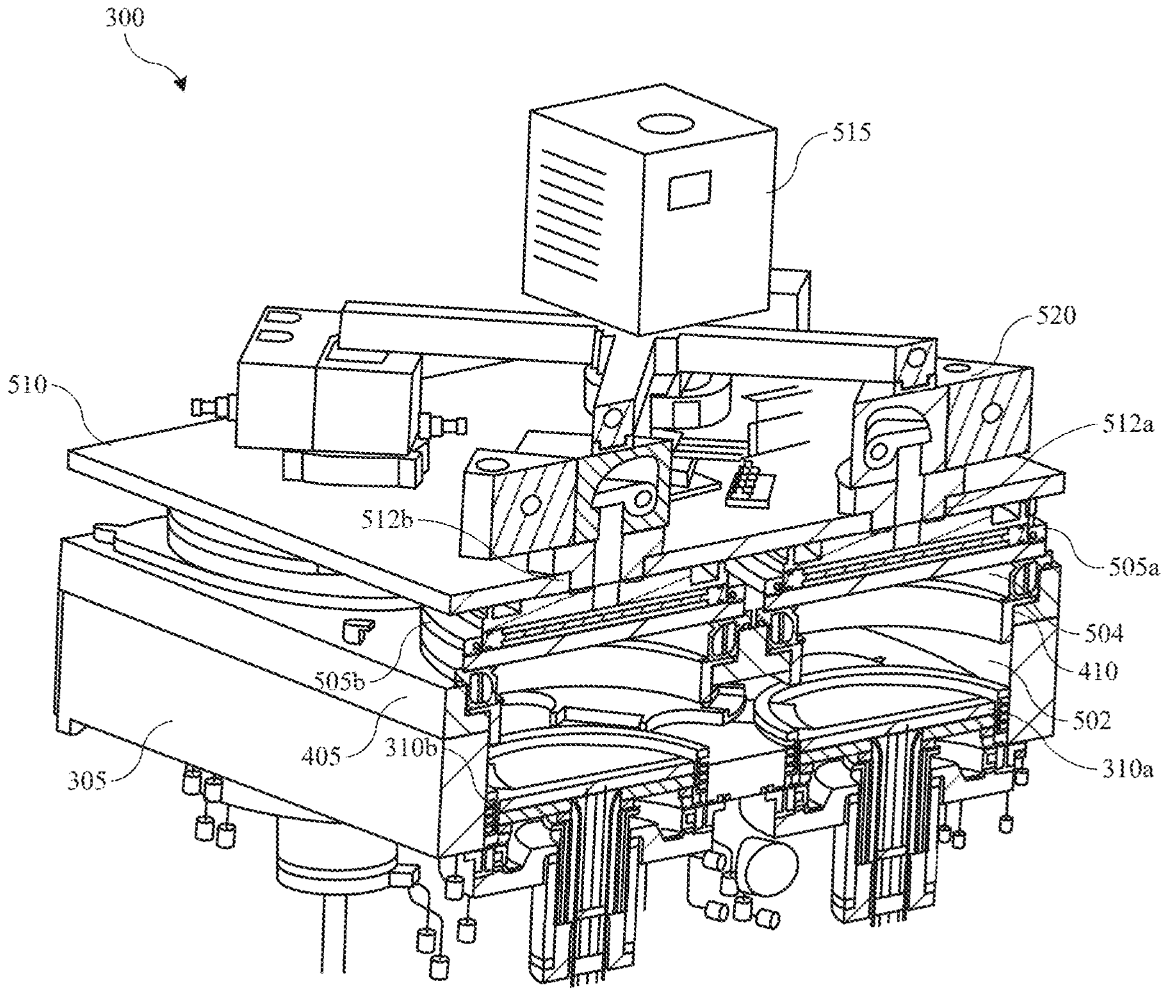
FIG. 5 shows a schematic partial isometric view of a chamber system according to some embodiments of the present technology.

FIG. 5 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505*a* may be aligned over substrate support 310*a*, and lid stack 505*b* may be aligned over substrate support 310*b*. When raised to operational positions, such as a second position, the substrates may deliver substrates for individual processing within the separate processing regions. When in this position, as will be described further below, each processing region 504 may be at least partially defined from below by an associated substrate support in the second position.

FIG. 5 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512*a* may provide fluid access to lid stack 505*a*. Aperture 512*a* may also be axially aligned with any of the lid stack components, as well as with substrate support 310*a* in some embodiments, which may produce an axial alignment for each of the components associated with individual processing regions, such as along a central axis through the substrate support or any of the components associated with a particular processing region 504. Similarly, aperture 512*b* may provide fluid access to lid stack 505*b*, and may be aligned, including axially aligned with components of the lid stack as well as substrate support 310*b* in some embodiments.

Figure 6A:
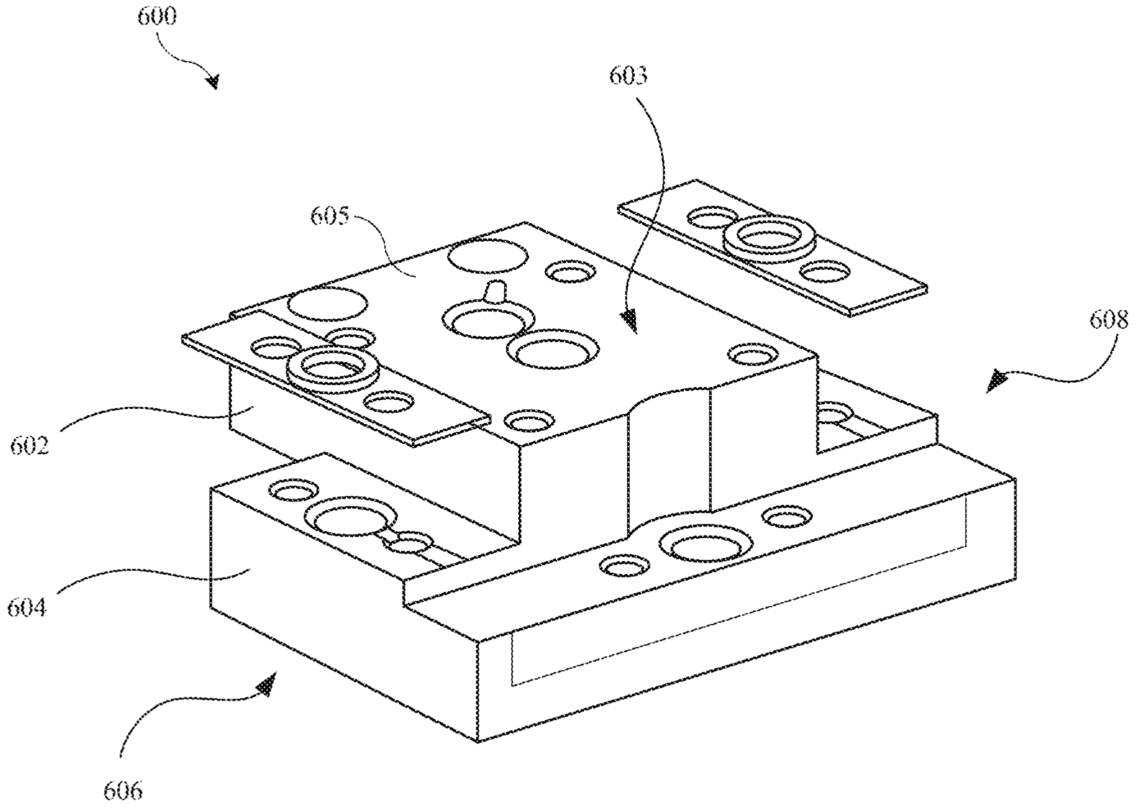
FIG. 6A shows a schematic isometric view of an exemplary modular gas block according to some embodiments of the present technology.
Figure 6B:
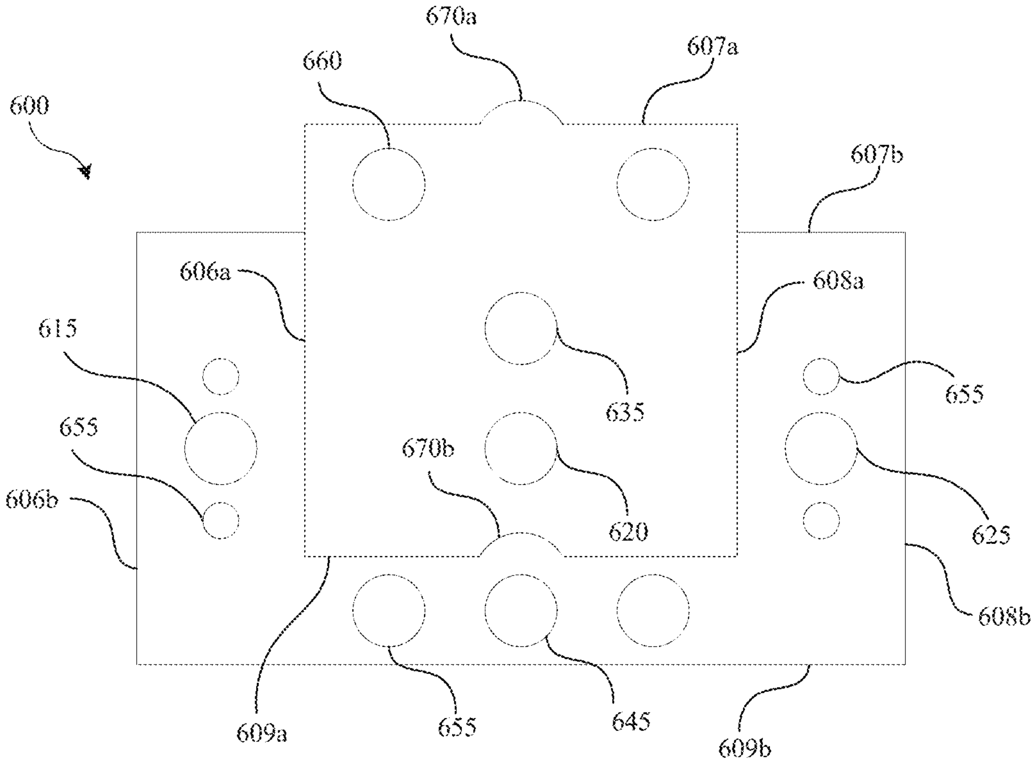
FIG. 6B illustrates a schematic top plan view of the modular gas block of FIG. 6A.

FIGS. 6A and 6B show a schematic isometric view and a top plan view, respectively, of an exemplary modular gas block 600 according to some embodiments of the present technology. Modular gas block 600 may form a portion of a gas stick that may be used as part of a gas delivery assembly for mixing and/or delivering one or more gases to a semiconductor processing system for performing one or more processing operations, such as deposition, etching, annealing, cleaning, and/or curing. As will be discussed in greater detail below, a number of modular gas block 600 may be assembled to generate a fluid channel that extends along both a length and a width (or both an x-axis and a z-axis) of a gas delivery assembly, which enables a number of gases to be mixed and/or otherwise delivered to one or more processing systems.

The gas block 600 may include a block body 605, with the block body 605 including an upper portion 602 and a lower portion 604. As illustrated, the upper portion 602 and lower portion 604 each has a generally rectangular prism shape, although other shapes may be utilized in various embodiments. As illustrated, a longer dimension of the lower portion 604 extends along the x-axis, while a longer dimension of the upper portion 602 extends along the z-axis, although other arrangements are possible in various embodiments. The block body 605 (and each of the upper portion 602 and lower portion 604) may have a first (or inlet) end 606 and a second (or outlet) end 608, as well as a medial region 603 that is disposed between the first end 606 and second end 608. A longitudinal axis of the block body 605 may extend through the first end 606 and the second end 608. The first end 606*a* of the upper portion 602 may terminate inward from the first end 606*b* of the lower portion 604 such that the first end 606*a* of the upper portion 602 projects upward from the lower portion 604. The second end 608*b* of the lower portion 604 may extend beyond the second end 608*a* of the upper portion 602 such that the second end 608*b* of the lower portion 604 forms a ledge with respect to the upper portion 602. In such a manner, a cross-section of the block body 605 may have a generally T-shape (possibly inverted) when taken along a length (e.g., along the x-axis) of the block body 605 in some embodiments. The shape of the block body 605 may depend on adjacent block geometry (such as the geometry of end blocks). For example, the block body 605 may have a T-shape, a Z-shape, an inverted Z-shape, a mirrored Z-shape, and/or other shape in various embodiments.

The block body 605 (and each of the upper portion 602 and lower portion 604) may have a first lateral surface 607 and a second lateral surface 609, which are separated by the medial region 603. A width of the block body 605 may extend through the first lateral surface 607 and the second lateral surface 609. The first latera surface 607*a* of the upper portion 602 may protrude beyond the first lateral surface 607*b* of the lower portion 604 such that the first lateral surface 607*a* of the upper portion 602 forms an overhand that extends beyond the first lateral surface 607*b* of the lower portion 604. The second lateral surface 609*b* of the lower portion 604 may extend beyond the second lateral surface 609*a* of the upper portion 602 such that the second lateral surface 609*b* of the lower portion 604 forms a ledge with respect to the upper portion 602. In such a manner, a cross-section of the block body 605 may have a generally Z-shape when taken along a width (e.g., along the z-axis) of the block body 605 in some embodiments. The shape of the block body 605 may depend on adjacent block geometry (such as the geometry of end blocks). For example, the block body 605 may have a T-shape, a Z-shape, an inverted Z-shape, a mirrored Z-shape, and/or other shape in various embodiments.

In some embodiments, a lower surface of the first lateral surface 607*a* of the upper portion 602 and the upper surface of the second lateral surface 609*b* of the lower portion 604 may be substantially coplanar. Such a design may enable multiple modular gas blocks 600 to be coupled together along a Z direction (e.g., with the first lateral surface 607*a* of one modular gas block 600 being coupled with the second surface 609*b* of another modular gas block 600) with the respective upper and lower surfaces of adjacent modular gas blocks 600 being substantially coplanar with one another. In some embodiments, to facilitate such a design, the first lateral surface 607*a* of the upper portion 602 and the second lateral surface 609*b* of the lower portion 604 may be substantially the same thickness, although as long as the lower surface of the first lateral surface 607*a* of the upper portion 602 and the upper surface of the second lateral surface 609*b* of the lower portion 604 are substantially coplanar the first lateral surface 607*a* of the upper portion 602 and the second lateral surface 609*b* of the lower portion 604 may have different thicknesses while still facilitating the coplanar coupling of multiple modular gas blocks 600.

Figure 6C:
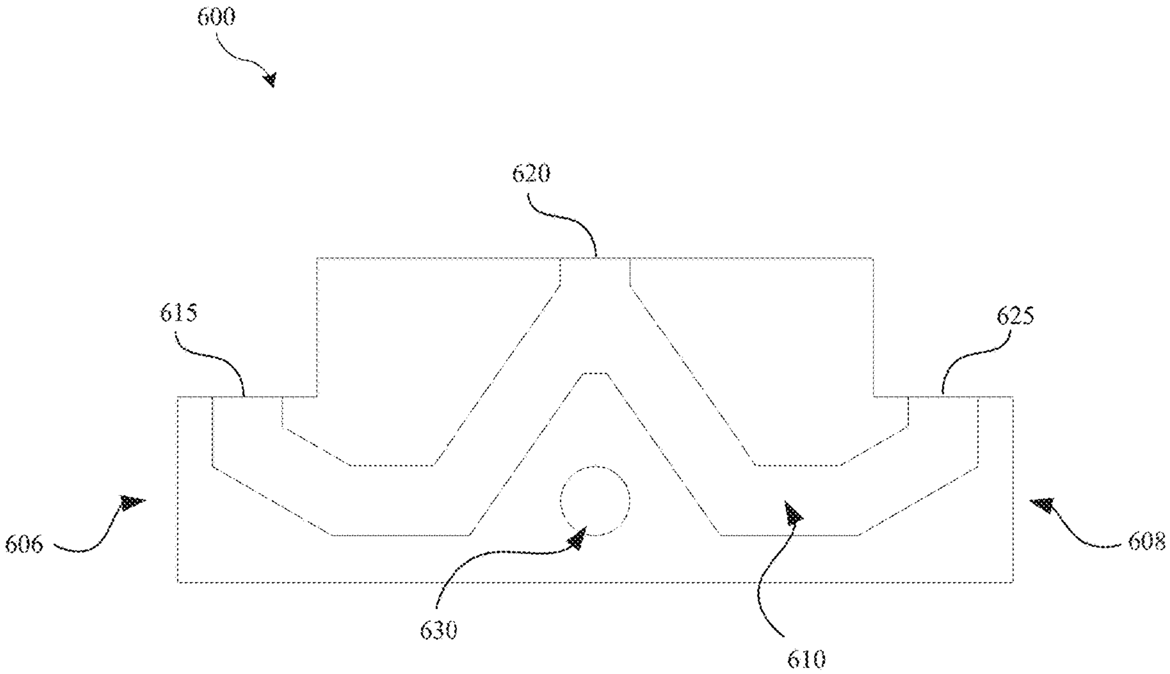
FIG. 6C illustrates a schematic cross-sectional side elevation view of the modular gas block of FIG. 6A.

FIG. 6C illustrates a schematic cross-sectional front elevation view (such as a cross-section taken along the x-axis) of modular gas block 600. The block body 605 may define a number of fluid channels that may be used to transport process and/or purge gases to a respective processing system. For example, as shown in FIG. 6C, the block body 605 may define a first fluid channel 610 that extends in a direction that is substantially parallel to the longitudinal axis (e.g., along the x-axis) of the block body 605. The first fluid channel 610 may be designed to transport gases from an inlet block to an x-direction block (not shown) along a length (or x-axis) of a gas delivery assembly. The first fluid channel 610 may include and/or be fluidly coupled with a fluid inlet 615, a first fluid port 620, and/or a fluid outlet 625. The fluid inlet 615 may extend through an upper surface of the first end 606*b* of the lower portion 604. As will be discussed below, the fluid inlet 615 may be used to fluidly couple the gas block 600 with a fluid outlet of an inlet block of a gas stick. The first fluid port 620 may extend through an upper surface of the medial region 603 of the upper portion 602. The first fluid port 620 may be interfaced with a flow regulation device, such as a valve, mass flow controller, and/or other device that may be seated atop the modular gas block 600 and which may control, regulate, and/or otherwise impact flow through the gas assembly. The fluid outlet 625 may extend through an upper surface of the second end 608*b* of the lower portion 604. As will be discussed below, the fluid outlet 625 may be used to fluidly couple the gas block 600 with an X-direction block of the gas stick. In some embodiments, the fluid inlet 615, the first fluid port 620, the fluid outlet 625, and the first gas path 610 may be linearly aligned along the length of the block body 605.

Figure 6D:
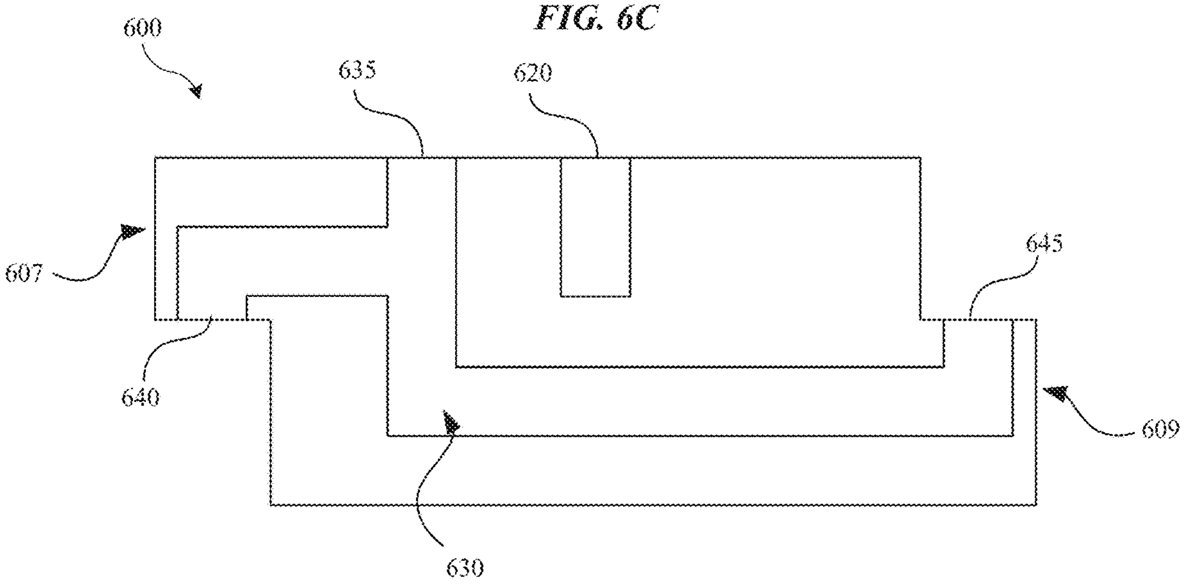
FIG. 6D illustrates a schematic cross-sectional front elevation view of the modular gas block of FIG. 6A.

FIG. 6D illustrates a schematic cross-sectional side elevation view (such as a cross-section taken along the z-axis) of modular gas block 600. Block body 605 may define a second fluid channel 630 that extends transversely to the longitudinal axis and the first fluid channel 610 to transport gases between adjacent modular gas blocks 600 along a width (or z-axis) of a gas delivery assembly. The second fluid channel 630 may include and/or be fluidly coupled with second fluid port 635, a third fluid port 640, and/or a fourth fluid port 645. Each of the second fluid port 635 and the third fluid port 640 may extend through an upper surface of the block body 605. For example, the second fluid port 635 may extend through an upward-facing surface of the upper portion 602 of the block body 605, such as within the medial region 603. The third fluid port 640 may extend through an upward-facing surface of the lower portion 604 of the block body 605, such as proximate the second lateral surface 609*b*. The fourth fluid port 645 may extend through a lower surface of the block body 605. For example, the fourth fluid port 645 may extend through a downward-facing surface of the upper portion 602 of the block body 605, such as proximate the first lateral surface 607*a*. The third fluid port 640 and/or the fourth fluid port 645 may be coupled with an adjacent modular gas delivery block 600 to fluidly couple the second fluid channels 630 of each modular gas delivery block 600 to facilitate mixing of gases from different gas sources along the Z-direction. For example, the second fluid channels 630 of at least two adjacent gas sticks may be fluidly coupled with one another by interfacing the third fluid port 640 of a first modular gas block 600 with the fourth fluid port 645 of a second modular gas block 600. In some embodiments, second fluid port 635, the third fluid port 640, and/or the fourth fluid port 645 may be linearly aligned along the width of the block body 605 and/or may be laterally offset from the fluid outlet 625 along the width of the block body 605.

In some embodiments, additional fluid ports may be provided. For example, one or more fluid ports may be defined within sidewalls of the block body 605 and may serve as fluid inlets and/or outlets for the gas delivery assembly. For example, a fluid port formed in a sidewall of the block body 605 may be coupled with a gas source that introduces a gas into the gas delivery assembly and/or may be coupled with a weldment and/or other gas delivery lumen that directs any gases from the gas delivery assembly to one or more processing chambers and/or manifolds. In some embodiments, each fluid port of the modular gas block 600 may extend along the Y-direction (e.g., through at least a portion of a thickness of the block body 605).

The first fluid channel 610 and the second fluid channel 630 may be distinct from one another and may be fluidly isolated from one another within the block body 605. The valve, mass flow controller, and/or other device that is interfaced with the first fluid port 620 may also be interfaced with the second fluid port 635. The valve may fluidly couple the first fluid port 620 with the second fluid port 635 to fluidly couple the first fluid channel 610 with the second fluid channel 630. The valve may also control flow between the first fluid channel 610 with the second fluid channel 630, which may enable the valve to control mixing between the two fluid channels and between the modular gas blocks 600 of adjacent gas sticks.

In some embodiments, the lateral surfaces of the block body 605 may include one or more mating features 670 that may be used to properly align the third and fourth fluid ports of adjacent modular gas blocks 600 to fluidly couple the second fluid channels 630 of the adjacent modular gas blocks 600. For example, one of the lateral surfaces (e.g., the first lateral surface 607*a* of the upper portion 602) may include a convex mating feature 670*a*, while the other lateral surface (e.g., the second lateral surface 609*b* of the lower portion 604) may include a concave mating feature 670*b*. When two modular gas blocks 600 are mated together, engagement between the concave mating feature 670*b* of the first modular gas block 600 and the convex mating feature 670*a* of the second modular gas block 600 may align the third fluid port 640 of the first modular gas block 600 with the fourth fluid port 645 of the second modular gas block 600 to fluidly couple the second fluid channels 630 of the two modular gas blocks 600 to facilitate mixing of gases between the two modular gas blocks 600 in the Z-direction.

Turning back to FIGS. 6A and 6B, the block body 605 may define a number of fastener receptacles, which may receive fasteners for securing multiple modular gas blocks 600 together and/or for securing flow regulation devices and/or other components to the modular gas block 600. For example, the first end 606*b* and the second end 608*b* of the lower portion 604 may each define a number of fastener receptacles 655 that may enable fasteners to be inserted through the receptacles 655 to couple the first end 606 of the modular gas block 600 with the second end 608 of another modular gas block 600, with an outlet end of an inlet block, and/or with an inlet end of an X-direction block. A number of fastener receptacles 660 may be defined through a thickness (e.g., in a Y-direction) of the modular gas block 600 proximate the first lateral surface 607*a* of the upper portion 602 and/or the second lateral surface 609*b* of the lower portion 604 that may enable fasteners to be inserted through the fastener receptacles 660 to couple additional modular gas blocks with the modular gas block 600 to promote gas flow and/or mixing in the Z-direction.

It will be appreciated that the designs of modular gas block 600 described above are merely provided as one example, and that numerous variations may exist that enable a number of modular gas blocks to be coupled with one another and/or to other gas blocks (e.g., an inlet block and/or an X-direction block) in a modular fashion. In some embodiments, each modular block in a given gas stick and/or gas delivery assembly may have identical geometries. However, in some embodiments, one or more of the modular gas blocks may have different geometries. For example, rather than having a T-shaped cross-section along the x-axis as shown in FIGS. 6A-6D, one or more modular gas blocks 600 may have a Z-shaped cross section along the x-axis. For example, the fluid inlet 620 may be formed in a lower surface of the first end 606*a* of the upper portion 602. This may enable the fluid inlet of the modified modular gas block to be interfaced with the fluid outlet 625 of another modular gas block 600 to facilitate flow of one or more gases in the X-direction.

Figure 7:
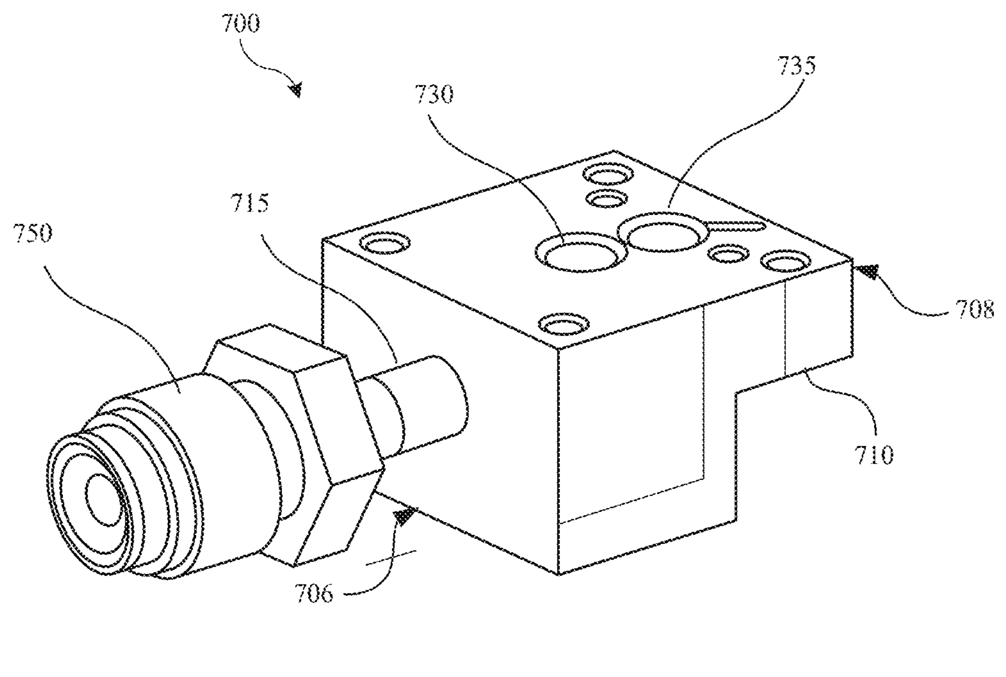
FIG. 7 illustrates a schematic isometric view of an inlet block according to some embodiments of the present technology.
Figure 7A:
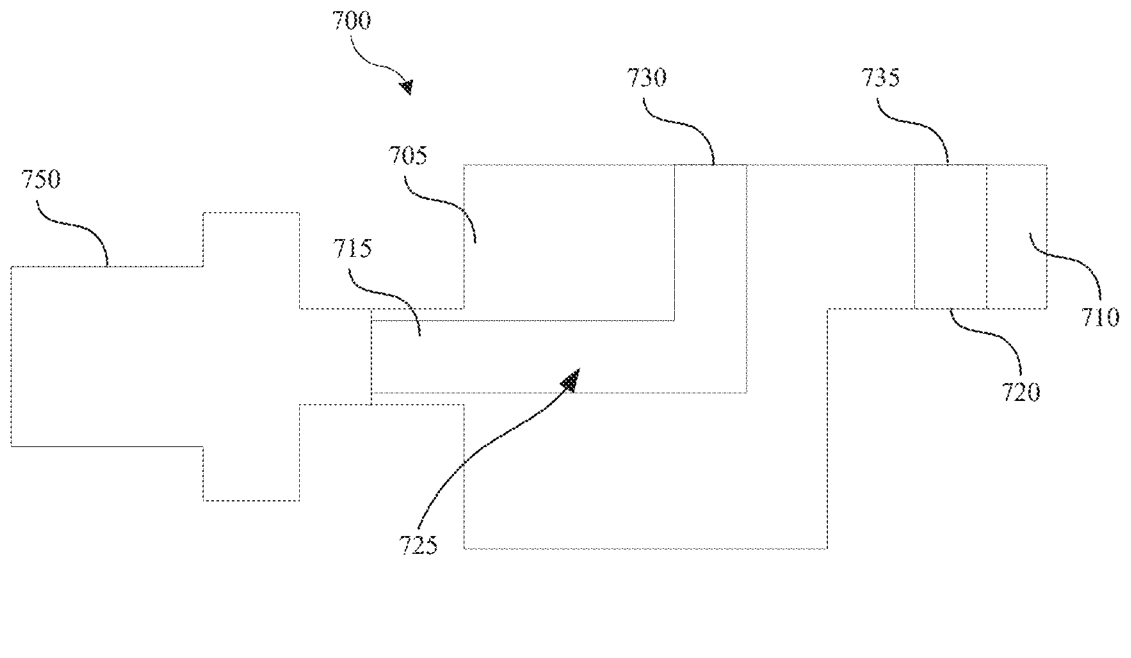
FIG. 7A illustrates a schematic cross-sectional side elevation view of the inlet block of FIG. 7.

FIGS. 7 and 7A illustrate a schematic isometric view and a schematic cross-sectional side elevation view, respectively, of an exemplary inlet block 700 according to some embodiments of the present technology. The inlet block 700 may form a portion of a gas stick that may be used as part of a gas delivery assembly for mixing and/or delivering one or more gases to a semiconductor processing system for performing one or more processing operations, such as deposition, etching, annealing, cleaning, and/or curing. As will be discussed in greater detail below, the inlet block 700 may be used to fluidly couple a gas source with downstream blocks (e.g., the modular gas block 600) and/or other components of a gas stick.

The inlet block 700 may include a block body 705. The block body 705 may include an inlet end 706 and an outlet end 708. A longitudinal axis of the block body 705 may extend through the first end 706 and the second end 708. The block body 705 may have an L-shaped cross-section in some embodiments. For example, an upper region of the outlet end 708 may include a protrusion 710 that extends rearward (e.g., away from the first end 706) beyond a lower region of the block body 705. It will be appreciated that other cross-sectional shapes are possible in various embodiments. As illustrated, the protrusion 710 is sized and shaped to be seated atop the first end 606*b* of the lower portion 604 of the modular gas block 600.

The inlet block 700 may define an inlet flow path 725 that may fluidly couple a gas source (such as a compressed gas source, vaporizer, and/or other fluid source) with the downstream blocks (e.g., the modular gas block 600) and/or other components of a gas stick. The inlet flow path 725 may be fluidly coupled with a fluid inlet 715, which may be defined within the inlet block 700. The fluid inlet 715 may extend through a lateral surface of the first end 706 in some embodiments. The fluid inlet 715 may be flush with the lateral surface of the first end 706 or may protrude away from the first end 706. For example, as illustrated, the fluid inlet 715 is cylindrical in shape and protrudes form the first end 706. The fluid inlet 715 may be coupled with a gas source, such as via one or more weldments 750, which may be interfaced with the fluid inlet 715. The inlet flow path 725 may be fluidly coupled with a fluid outlet 720, which may be defined within the inlet block 700. As illustrated, the fluid outlet 720 extends through a downward-facing surface of the protrusion 710, which may enable the fluid outlet 720 to be aligned with and fluidly coupled with the fluid inlet 615 of the modular gas block 600.

In some embodiments, the inlet flow path 725 may be fluidly coupled with a first fluid port 730 and a second fluid port 735. Each of the first fluid port 730 and the second fluid port 735 may be coupled with a distinct portion of the inlet flow path 725, with the portions of the inlet flow path being fluidly isolated from one another. The first fluid port 730 and the second fluid port 735 may extend through a same surface of the block body 705, such as a top surface of the block body 705. This may enable both fluid ports to be interfaced with a flow regulation device, such as a valve, mass flow controller, and/or other device that may be seated atop the inlet block 700 and which may control, regulate, and/or otherwise impact flow from the first fluid port 730 to the second fluid port 735.

Figure 8:
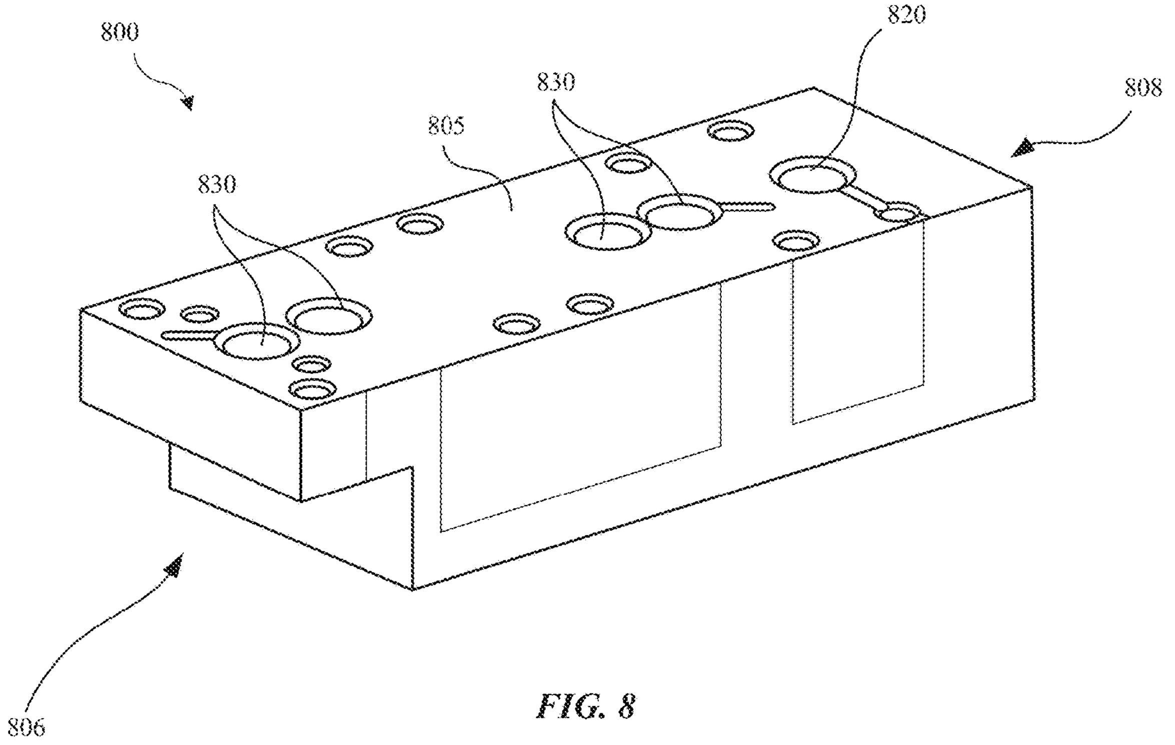
FIG. 8 illustrates a schematic isometric view of an X-direction block according to some embodiments of the present technology.
Figure 8A:
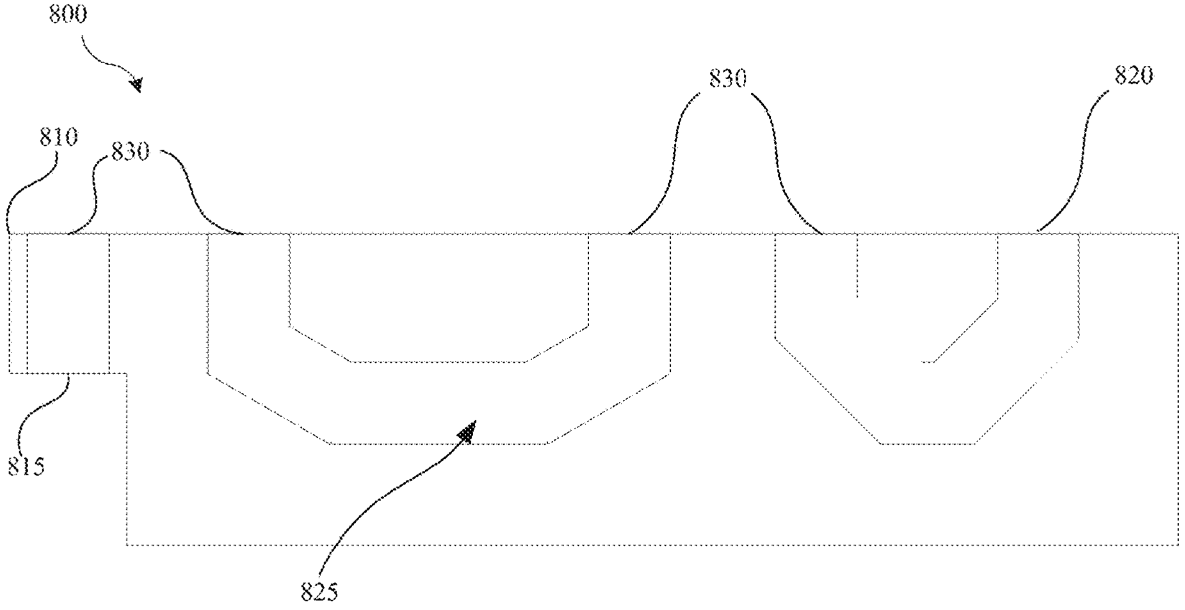
FIG. 8A illustrates a schematic cross-sectional side elevation view of the X-direction block of FIG. 8.

FIGS. 8 and 8A illustrate a schematic isometric view and a schematic cross-sectional side elevation view, respectively, of an exemplary X-direction block 800 according to some embodiments of the present technology. The X-direction block 800 may form a portion of a gas stick that may be used as part of a gas delivery assembly for mixing and/or delivering one or more gases to a semiconductor processing system for performing one or more processing operations, such as deposition, etching, annealing, cleaning, and/or curing.

The X-direction block 800 may include a block body 805. The block body 805 may include an inlet end 806 and an outlet end 808. A longitudinal axis of the block body 805 may extend through the first end 806 and the second end 808. The block body 805 may have an L-shaped cross-section in some embodiments. For example, an upper region of the inlet end 806 may include a protrusion 810 that extends forward (e.g., away from the second end 808) beyond a lower region of the block body 805. It will be appreciated that other cross-sectional shapes are possible in various embodiments. As illustrated, the protrusion 810 is sized and shaped to be seated atop the second end 608*b* of the lower portion 604 of the modular gas block 600.

The X-direction block 800 may define a flow path 825 that may fluidly couple a number of modular gas blocks 600 with other downstream components of a gas stick. The flow path 825 may be fluidly coupled with a fluid inlet 815, which may be defined within the X-direction block 800. The fluid inlet 815 may extend through a lower surface of the first end 806 in some embodiments. For example, the fluid inlet 815 may be defined in a downward-facing surface of the protrusion 810, which may enable the fluid inlet 815 to be aligned with and fluidly coupled with the fluid outlet 625 of the modular gas block 600 when the protrusion 810 is seated atop the second end 608*b* of the lower portion 604 of the modular gas block 600. The flow path 825 may be fluidly coupled with a fluid outlet 820, which may be defined within the X-direction block 800. As illustrated, the fluid outlet 820 extends through an upward-facing surface of the block body 805 proximate the second end 808.

In some embodiments, the flow path 825 may be fluidly coupled with a number of fluid ports 830. Each of the fluid ports 830 may extend through a same surface of the block body 805, such as a top surface of the block body 805. This may enable two or more of the fluid ports 830 to be interfaced with a flow regulation device, such as a valve, mass flow controller, and/or other device that may be seated atop the X-direction block 800 and which may control, regulate, and/or otherwise impact flow along the flow path 825.

Figure 9:
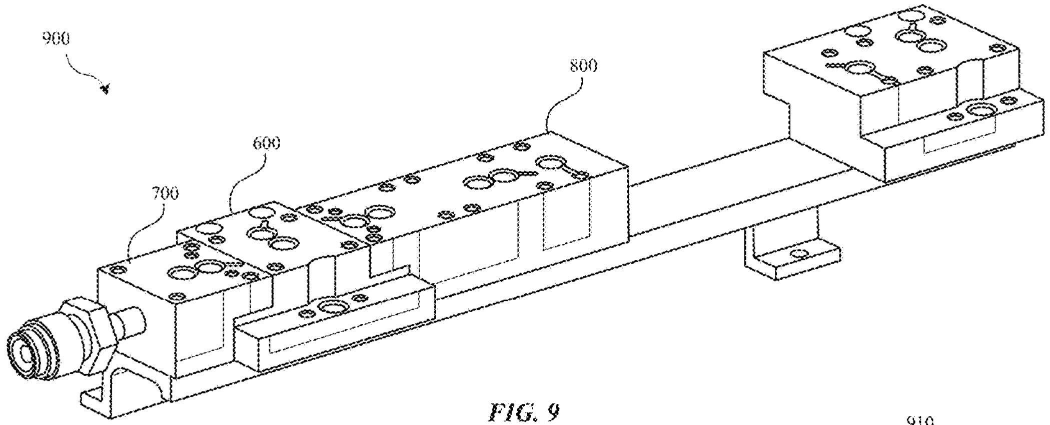
FIG. 9 illustrates a schematic isometric view of a gas stick according to some embodiments of the present technology.
Figure 9A:
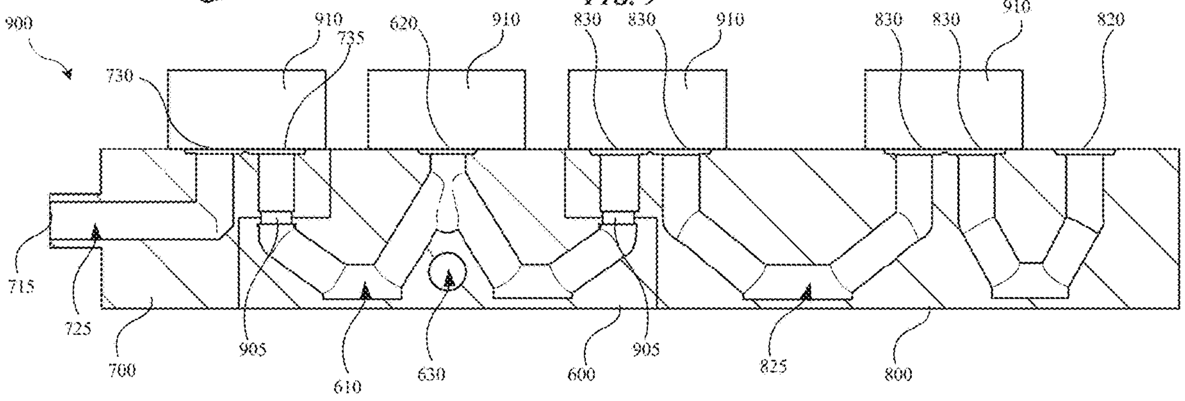
FIG. 9A illustrates a schematic cross-sectional side elevation view of the gas stick of FIG. 9.

FIGS. 9 and 9A illustrate a schematic isometric view and a schematic cross-sectional front elevation view, respectively, of a gas stick 900. As illustrated, an inlet block 700, one or more modular gas blocks 600, and an X-direction block 800 may be coupled along a length (or x-axis) of the gas stick 900 to form a fluid path that extends along a length of the gas stick 900. While shown with one modular gas block 600, it will be appreciated that the gas stick 900 may include any number of modular gas delivery blocks 600 in various embodiments.

As illustrated, the inlet block 700 is coupled with the modular gas block 600 with the protrusion 710 being seated atop the first end 606*b* of the lower portion 604 of the modular gas block 600 such that the fluid outlet 720 is aligned with and fluidly coupled with the fluid inlet 615 of the modular gas block 600. The X-direction block 800 is coupled with the modular gas block 600 with the protrusion 810 being seated atop the second end 608*b* of the lower portion 604 of the modular gas block 600 such that the fluid inlet 815 is aligned with and fluidly coupled with the fluid outlet 625 of the modular gas block 600. When assembled, the inlet block 700, the modular gas block 600, and the X-direction block 800 within the gas stick 900 may have top surfaces that are generally coplanar with one another and bottom surfaces that are generally coplanar with one another.

As noted above, any number of modular gas blocks 600 may be joined end to end along a length of the gas stick 900. The gas stick 900 may include a proximal end proximate the inlet block 700 and a distal end proximate the X-direction block 800. One or more seals 905, such as C-seals, may be disposed at the interface between the inlet block 700 and the modular gas block 600 and at the interface between the modular gas block 600 and the X-direction block 800. In some embodiments, one or more seals may be disposed at each fluid port of a given gas block to seal the interface between the respective fluid port and a flow control device 910 (such as a valve, mass flow controller, etc.) interfaced with the fluid port. Flow control devices 910 may be used to control flow along the gas stick 900 in the x-direction and/or to control flow of gas through the second fluid channel 630 of the modular gas block 600 to facilitate mixing of gases from the gas stick 900 to an adjacent gas stick 900 that is coupled with the second fluid channel 630 of the modular gas block 600.

Figure 10:
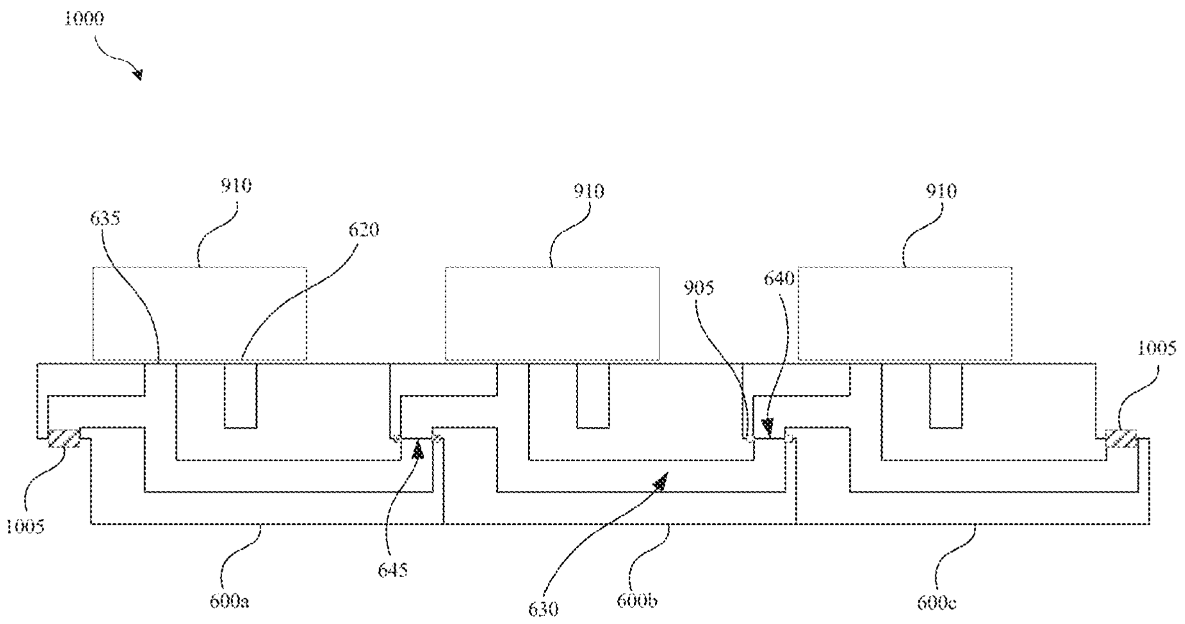
FIG. 10 illustrates a schematic cross-sectional front elevation view of a gas delivery assembly according to some embodiments of the present technology.

FIG. 10 illustrates a schematic cross-sectional side elevation view of a number of modular gas blocks 600 of different gas sticks 900 being coupled to form a portion of a gas delivery assembly 1000. As illustrated, three modular gas blocks 600 are coupled along a width (or z-axis) of the gas delivery assembly 1000 to form a fluid path that extends along a width of the gas delivery assembly 1000 to facilitate mixing of different gases within adjacent gas sticks 900. Each line of modular gas blocks 600 along the z-direction may be form a portion of a separate gas stick 900 and may be coupled with a different gas source. While shown with three modular gas blocks 600, it will be appreciated that the gas delivery assembly 1000 may include any number of modular gas delivery blocks 600 in various embodiments. Additionally, one or more modular gas blocks 600 may be added to or removed from the gas delivery assembly to add or remove different gas sources.

As illustrated, a second modular gas block 600*b* may be positioned between a first modular gas block 600*a* and a third modular gas block 600*c*. For example, the third fluid port 640 of the first modular gas block 600*a* may be aligned and interfaced with the fourth fluid port 645 of the second modular gas block 600*a* to fluidly couple the second fluid channels 630 of the first modular gas block 600*a* and the second modular gas block 600*b* with one another. Fluidly coupling adjacent modular gas blocks 600 along a width of the gas delivery assembly 1000 with an adjacent modular gas delivery block 600 to fluidly couple the second fluid channels 630 of each modular gas delivery block 600 to facilitate mixing of gases from different gas sources along the Z-direction.

In some embodiments, interfaces formed between at least some of the fluid ports of the coupled modular gas blocks 600 include sealing mechanisms. For example, couplings between fourth fluid ports 635 and/or second fluid ports 620 and flow regulation devices may include O-rings, gaskets, C-seals, and/or other sealing mechanisms that may prevent gases from leaking out of the second fluid channels 620 at the various interfaces between adjacent modular gas blocks 600. When assembled, the modular gas blocks 600 within the gas delivery assembly 1000 may have top surfaces that are generally coplanar with one another and bottom surfaces that are generally coplanar with one another.

A flow control device 910 may be coupled with each modular gas block 600 to fluidly couple the second flow path 630 of the modular gas block 600 with the first fluid channel 610 of the respective modular gas block 600 to control flow and mixture of gases in the Z-direction between modular gas blocks 600 of different gas sticks 900.

To seal the joined second fluid channels 630 of the modular gas blocks 600, the exposed fourth fluid port 646 of a laterally outward-most modular gas block 600 (here, first modular gas block 600*a*) and the third fluid port 640 of an opposing laterally outward-most modular gas block 600 (here, third modular gas block 600*c*) may be obstructed, such as by plugging, capping, and/or otherwise closing off the respective third fluid port 640 and/or fourth fluid port 645 with an obstruction 1005. To add new gas sticks to the gas delivery assembly 1000, the obstruction 1005 (such as a cap, plug, and/or other blockage) may be removed from a respective fluid port on the modular gas blocks 600 on a given lateral side of the gas delivery assembly 1000.

As noted above, any number of modular gas blocks 600 may be joined side to side to form a width of the gas delivery assembly 1000. To add new gas sticks to the gas delivery assembly 1000, the obstruction 1005 (such as a cap, plug, and/or other blockage) may be removed from a respective fluid port on the modular gas blocks 600 on a given side (e.g., far lateral side) of the gas delivery assembly 1000. Additional modular gas blocks 600 may then be interfaced with the exposed fluid ports to expand the gas delivery assembly 1000 to incorporate additional gas sticks 900. In some embodiments, interfaces formed between at least some of the fluid ports of the coupled modular gas blocks 600 include sealing mechanisms. For example, couplings between adjacent first fluid ports 615 and third fluid ports 625 may include O-rings, gaskets, C-seals, and/or other sealing mechanisms that may prevent gases from leaking out of the second fluid channels 630 at the various interfaces between adjacent modular gas blocks 600.

Figure 11:
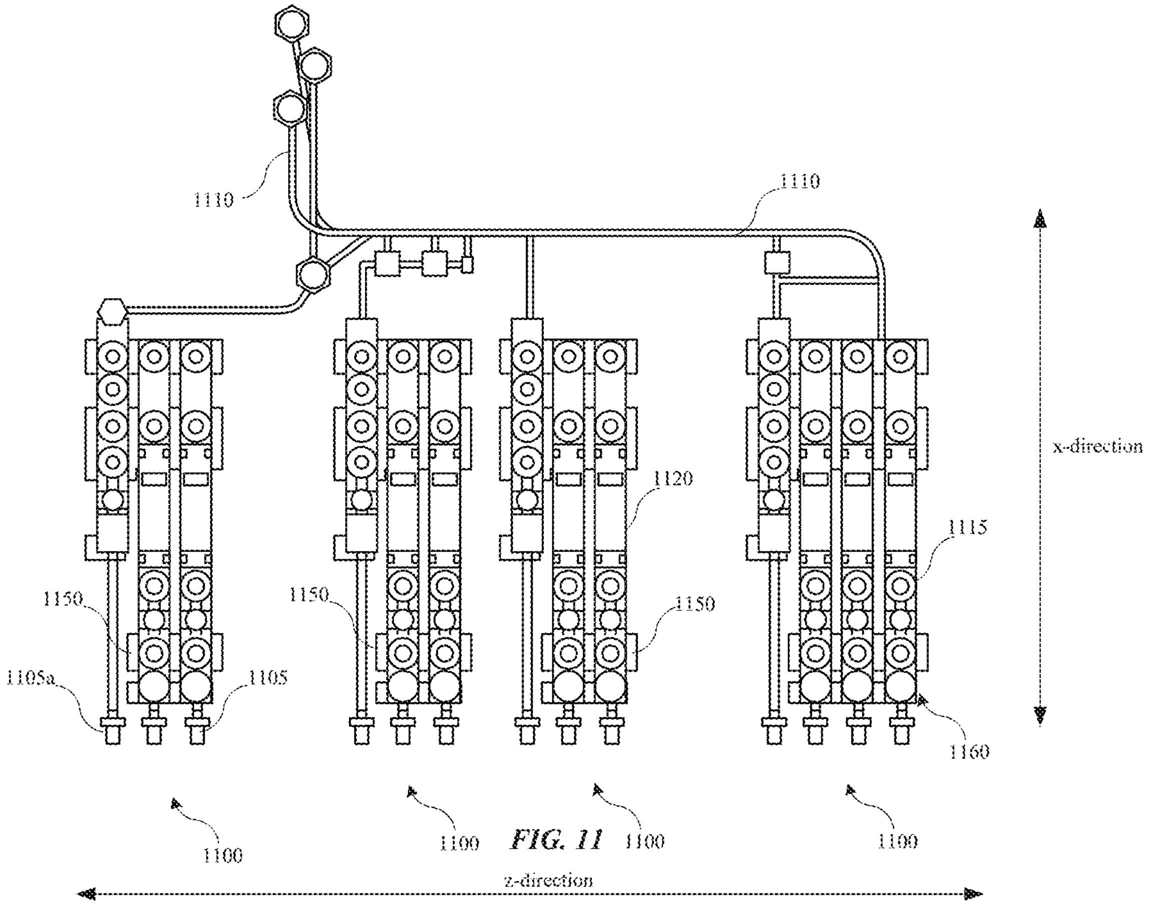
FIG. 11 illustrates a schematic top plan view of a number of gas delivery assemblies according to some embodiments of the present technology.

Oftentimes, a number of different gases may be supplied to a processing chamber. Some of the gases may be mixed prior to being introduced to the processing chamber, which may help to reduce the complexity of conduits extending between gas sources and the processing chambers. The use of modular gas blocks 600 may enable the design and assembly of an easily customizable gas delivery assembly that may enable gases from one or more gas sources to be flowed to one or more processing chambers and/or mixed prior to delivery of the gases to the one or more processing chambers. FIG. 11 illustrates a gas delivery assembly 1100 that incorporates a number of gas sticks 1160 that each include one or more modular gas blocks 1150 arranged along a width of the respective gas delivery assembly 1100 to facilitate delivery and/or mixing of a number of gases between adjacent gas sticks 1160. Modular gas blocks 1150 may be similar to the modular gas blocks 600 described herein, and may include any feature described in accordance therewith. As illustrated, modular gas blocks 1150 are coupled side-by-side along a width (or z-axis) of the gas delivery assembly 1100 to form a fluid path that extends along a width of the gas delivery assembly 1100. It will be appreciated that each gas delivery assembly 1100 may include any number of modular gas delivery blocks 1150 in various embodiments. Additionally, one or more modular gas blocks 1150 may be added to or removed from the gas delivery assembly to add or remove different gas sources. Modular gas blocks 1150 at the extreme sides of a given assembly 1100 may include fluid ports (e.g., third fluid ports 640 and/or fourth fluid ports 645) are unused (e.g., not coupled with an adjacent modular gas block 1150). In such embodiments, such unused ports may be obstructed, such as by plugging, capping, and/or otherwise closing off the respective port with an obstruction as described in accordance with FIG. 9. To add new gas sticks to the gas delivery assembly 1100, the obstruction (such as a cap, plug, and/or other blockage) may be removed from a respective fluid port on the modular gas blocks 00 on a given side (e.g., proximal or distal side) of the gas delivery assembly 1100. Additional modular gas blocks 1150 may then be interfaced with the exposed fluid ports to expand the gas delivery assembly 1100 to incorporate additional gas sticks. In some embodiments, interfaces formed between at least some of the fluid ports of the coupled modular gas blocks 1150 include sealing mechanisms. For example, couplings between adjacent lateral outlet ports may include O-rings, gaskets, C-seals, and/or other sealing mechanisms that may prevent gases from leaking out of the various interfaces between adjacent modular gas blocks 1150.

Each gas stick 1160 may incorporate any feature of previously described gas sticks, such as gas stick 900. For example, the second fluid channels (e.g., second fluid channels 630) of the various modular gas blocks 1150 may deliver gases from gas sources 1105 to an outlet 1110 of the gas delivery assembly 1100 for subsequent delivery to one or more processing chambers and/or manifolds. The first fluid channels (e.g., first fluid channels 610) may enable mixing of the gases flowing within some or all of the second fluid channels along a width of the gas delivery assembly 1100. The flow and/or mixing of gases through the various fluid channels of the modular gas blocks 1150 may be controlled using one or more flow regulation devices, such as valves 1115, mass flow controllers 1120, and the like, which may be each be coupled with a respective one of the modular gas blocks 1150 or other components of the gas sticks 1160, such as via the second fluid port and/or the first fluid port or fluid ports 830, first fluid port 730, and/or second fluid port 735. For example, various valves 1115 may be utilized to control whether and/or how much of a particular gas (or mixture of gases) flows through a given fluid channel and/or fluid channel of a given modular gas block 1150. When coupled together, fluid ports (e.g., third fluid port 640 and/or fourth fluid port 645) of some or all of adjacent gas blocks may be aligned and fluidly coupled with one another to facilitate mixing gases between different gas sticks 1160.

As illustrated, each gas delivery assembly 1100 includes three or four gas sources 1105 (e.g., one per gas stick 1160), which may include one or more purge gas sources 1105*a*. However, in other embodiments other numbers of gas sources 1105 may be utilized, with some or all of the gas sources 1105 being purge gas sources 1105*a*. For example, a given gas delivery assembly 1100 may include at least or about one gas source 1105, at least or about two gas sources 1105, at least or about three gas sources 1105, at least or about four gas sources 1105, at least or about five gas sources 1105, at least or about six gas sources 1105, or more. Each gas delivery assembly 1100 may include an outlet 1110, such as an output weldment, which may deliver any combination of one or more gases from the gas delivery assembly 1100 to one or more processing chambers and/or manifolds. As illustrated, a length of each gas stick 1160 defines an X-direction, a width of each gas stick 1160 defines a Z-direction, and a thickness of each gas stick 1160 defines a Y-direction of the gas delivery assembly 1100.

By using modular gas blocks 1150 to generate the gas delivery assembly 1100, embodiments of the present invention may facilitate gas mixing between adjacent gas sticks in the x-direction without the use of a network of weldments at the bottom of the gas delivery assembly, which may significantly simplify the design and fabrication of the gas delivery assembly and reduce the time and cost associated therewith. In some embodiments, each block 1150 within the gas delivery assembly 1100 may have an identical geometry or design, which may simplify the construction of a given gas delivery assembly 1100. In other embodiments, gas delivery assembly 1100 may include some different modular gas blocks (such as modular gas blocks 600 having alternative coupling geometries, such as Z-shaped cross-sections along a length of the modular gas block). In some embodiments, modular gas blocks 1150 at an extreme proximal and/or distal end of the width and/or length of the gas delivery assembly 1100 may be different to accommodate connections with other components, such as weldments from gas sources, outlets, and the like. Such a modular design may enable a single type (or small number of types) of modular gas blocks 1100 on hand to generate different configurations of gas delivery assemblies.

Figure 12:
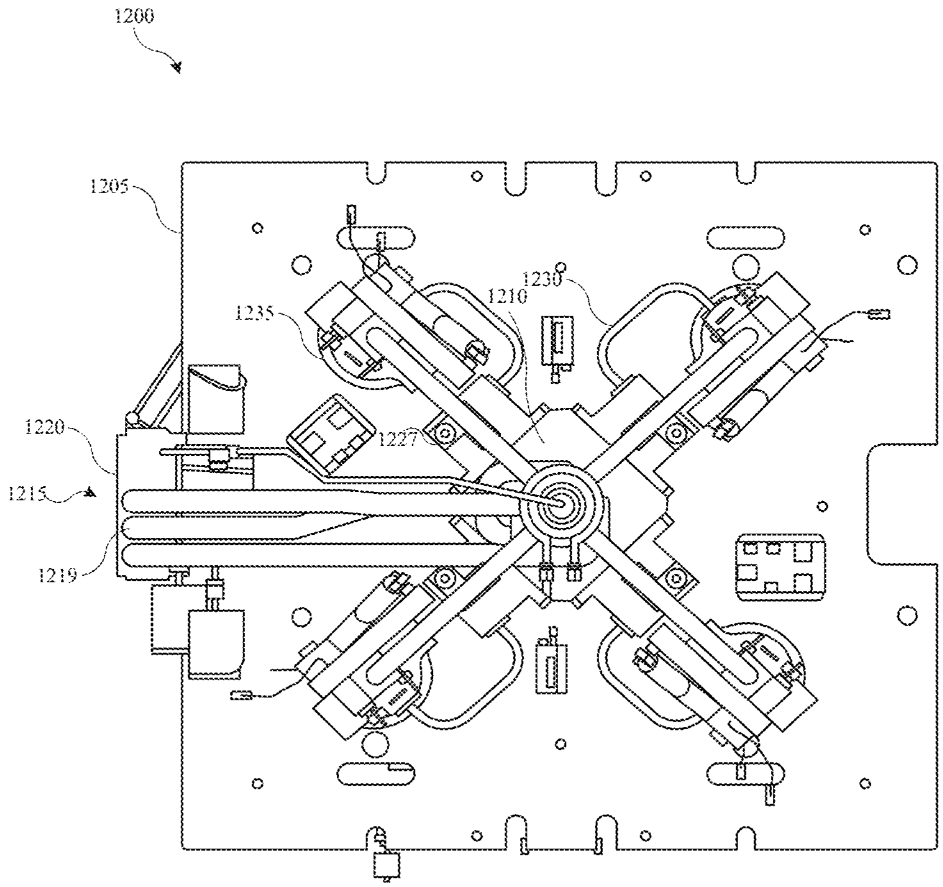
FIG. 12 shows a schematic top plan view of a semiconductor processing system according to some embodiments of the present technology.

As noted above, each gas delivery assembly may include an outlet that delivers a mixture of one or more gases to one or more processing chambers and/or manifolds. For example, the gas delivery assembly may be remotely located from the processing chambers (such as below the processing chamber). The outlets may be coupled with fluid lines, such as weldments, that direct the gases from the gas delivery assembly to the processing chambers and/or manifolds. FIG. 12 shows a schematic top plan view of one embodiment of a semiconductor processing system 1200 according to some embodiments of the present technology. The figure may include components of any of the systems illustrated and described previously, and may also show further aspects of any of the previously described systems. It is to be understood that the illustration may also show exemplary components as would be seen on any quad section 109 described above.

Semiconductor processing system 1200 may include a lid plate 1205, which may be similar to second lid plate 510 previously described. For example, the lid plate 1205 may define a number of apertures, similar to apertures 512, which provide access to a number of processing chambers positioned beneath the lid plate 1205. Each aperture of the plurality of apertures may be defined to provide fluid access to a specific lid stack, processing chamber, and/or processing region.

A gas splitter assembly 1210 may be seated on a top surface of the lid plate 1205. For example, the gas splitter assembly 1210 may be centered between the apertures of the lid plate 1205. The gas splitter assembly 1210 may be fluidly coupled with a number of input weldments 1215 that are each coupled with a respective outlet of a gas delivery assembly, such as gas delivery assembly 1000. Input weldments 1215 may deliver gases, such as precursors, plasma effluents, and/or purge gases from a number of gas sources to the gas splitter assembly 1210. For example, each of the input weldments 1215 may extend vertically from gas delivery assemblies positioned below the lid plate 1205 and pass through a feedthrough plate 1220. A portion of the input weldments 1215 above the feedthrough plate 1220 may be bent horizontally and may direct the gases toward the gas splitter assembly 1210. In some embodiments, some or all of the input weldments 1215 may be disposed within heater jackets 1219 that help prevent heat loss along the length of the input weldments 1215.

The gas splitter assembly 1210 may receive gases from the input weldments 1215 and may recursively split the gas flows into a greater number of gas outputs that are each interfaced with one or more valves 1227 that help control flow of gases through the valve block 1225. For example, actuation of the valves 1227 may control whether purge and/or process gases are flowed to a respective processing chamber or are diverted away from the processing chamber to another location of the system 1200. For example, outlets of gas splitter assembly 1210 may each be fluidly coupled with an output weldment 1230, which may deliver the purge gas and/or process gas to an output manifold 1235 associated with a particular processing chamber. For example, an output manifold 1235 may be positioned over each aperture formed within the lid plate 1205 and may be fluidly coupled with the lid stack components to deliver one or more gases to a processing region of a respective processing chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate to in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate to in the context of the systems, devices, circuits, methods, and other implementations described herein.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a heater” includes a plurality of such heaters, and reference to “the protrusion” includes reference to one or more protrusions and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

What is claimed is:

1. A modular gas block, comprising:
- a block body having an inlet end and an outlet end, the block body defining a portion of a first fluid channel extending along a length of the block body and defines a second fluid channel extending along a width of the block body, wherein:
  - the inlet end of the block body defines a fluid inlet that is fluidly coupled with the first fluid channel;
  - the outlet end of the block body defines a first fluid outlet that is fluidly coupled with the first fluid channel;
  - an upper surface of the block body defines a first fluid port that is fluidly coupled with the fluid inlet via the first fluid channel;
  - the upper surface of the block body defines a second fluid port that is fluidly coupled with the second fluid channel;
  - the block body defines a third fluid port that is fluidly coupled with the second fluid port via the second fluid channel; and
  - the block body defines a fourth fluid port that is fluidly coupled with the second fluid port and the third fluid port via the second fluid channel.

2. The modular gas block of claim 1, wherein:
- the first fluid channel and the second fluid channel are fluidly isolated from one another within the block body.

3. The modular gas block of claim 1, wherein:
- the third fluid port is laterally offset from the first fluid outlet along the width of the block body.

4. The modular gas block of claim 1, wherein:
- the third fluid port extends through an upward-facing surface of the block body and the fourth fluid port extends through a downward-facing surface of the block body.

5. The modular gas block of claim 1, wherein:
- the block body has a generally Z-shaped cross-section along the width of the block body.

6. The modular gas block of claim 1, wherein:
- the block body has a generally T-shaped cross-section along the length of the block body.

7. The modular gas block of claim 1, wherein:
- the fluid inlet, the first fluid port, the first fluid outlet, and the first fluid channel are linearly aligned along the length of the block body.

8. The modular gas block of claim 1, wherein:
- the second fluid port, the third fluid port, and the second fluid channel are linearly aligned along the width of the block body.

9. A modular gas delivery assembly, comprising:
- an inlet block defining a first fluid inlet and a first fluid outlet, wherein an inlet flow path is fluidly coupled with the first fluid inlet and the first fluid outlet;
- a modular gas block comprising:
  - a block body having an inlet end and an outlet end, the block body defining a portion of a first fluid channel extending along a length of the block body and defines a second fluid channel extending along a width of the block body, wherein:
    - the inlet end of the block body defines a second fluid inlet that is interfaced with the first fluid outlet and is fluidly coupled with the first fluid channel;
    - the outlet end of the block body defines a second fluid outlet that is fluidly coupled with the first fluid channel;
    - an upper surface of the block body defines a first fluid port that is fluidly coupled with the second fluid inlet via the first fluid channel;
    - the upper surface of the block body defines a second fluid port that is fluidly coupled with the second fluid channel;
    - the block body defines a third fluid port that is fluidly coupled with the second fluid port via the second fluid channel; and
    - the block body defines a fourth fluid port that is fluidly coupled with the second fluid port and the third fluid port via the second fluid channel; and
  - an X-direction block that defines a third fluid inlet and a third fluid outlet, wherein the third fluid inlet is fluidly coupled with the second fluid outlet.

10. The modular gas delivery assembly of claim 9, wherein:
- the inlet block defines a plurality of fluid ports that are fluidly coupled with the inlet flow path.

11. The modular gas delivery assembly of claim 10, further comprising:
- a valve that is interfaced with and that fluidly couples the plurality of fluid ports of the inlet block.

12. The modular gas delivery assembly of claim 9, further comprising:
- a valve interfaced with the first fluid port and the second fluid port, wherein the valve fluidly couples the first fluid channel with the second fluid channel.

13. The modular gas delivery assembly of claim 9, further comprising:
- a weldment of a gas source, the weldment being coupled with the first fluid inlet.

14. The modular gas delivery assembly of claim 9, wherein:
- the modular gas block comprises a first modular gas block; and
- the modular gas delivery assembly comprises a second modular block that is coupled between the second fluid outlet and the third fluid inlet.

15. A modular gas delivery assembly, comprising:
- a plurality of gas sticks, wherein each gas stick comprises:
  - an inlet block defining a first fluid inlet and a first fluid outlet, wherein an inlet flow path is fluidly coupled with the first fluid inlet and the first fluid outlet;
  - a modular gas block comprising:
    - a block body having an inlet end and an outlet end, the block body defining a portion of a first fluid channel extending along a length of the block body and defines a second fluid channel extending along a width of the block body, wherein:

the inlet end of the block body defines a second fluid inlet that is interfaced with the first fluid outlet and is fluidly coupled with the first fluid channel;

the outlet end of the block body defines a second fluid outlet that is fluidly coupled with the first fluid channel;

an upper surface of the block body defines a first fluid port that is fluidly coupled with the second fluid inlet via the first fluid channel;

the upper surface of the block body defines a second fluid port that is fluidly coupled with the second fluid channel;

the block body defines a third fluid port that is fluidly coupled with the second fluid port via the second fluid channel; and the block body defines a fourth fluid port that is fluidly coupled with the second fluid port and the third fluid port via the second fluid channel; and an X-direction block that defines a third fluid inlet and a third fluid outlet, wherein:

the third fluid inlet is fluidly coupled with the second fluid outlet; and the second fluid channel of at least two adjacent gas sticks are fluidly coupled with one another by interfacing the third fluid port of a first modular gas block with the fourth fluid port of a second modular gas block.

16. The modular gas delivery assembly of claim 15, wherein:

a length of each gas stick defines an X-direction, a width of each gas stick defines a Z-direction, and a thickness of each gas stick defines a Y-direction; and each of the first fluid port, the second fluid port, the third fluid port, and the fourth fluid port extends along the Y-direction.

17. The modular gas delivery assembly of claim 15, further comprising:

a plurality of gas sources, wherein each of the plurality of gas sources is fluidly coupled with the first fluid inlet of the inlet block of one of the plurality of gas sticks.

18. The modular gas delivery assembly of claim 15, wherein:

a first lateral surface of each modular gas block comprises a concave mating feature;

a second lateral surface of each modular gas block comprises a convex mating feature;

the first lateral surface of each modular gas block is opposite the second lateral surface; and engagement between the concave mating feature of the first modular gas block and the convex mating feature of the second modular gas block aligns the third fluid port of the first modular gas block with the fourth fluid port of the second modular gas block.

19. The modular gas delivery assembly of claim 15, further comprising:

a plurality of seals, wherein each seal of the plurality of seals is disposed at the interface between adjacent blocks forming the plurality of gas sticks.

* * * * *